(12) United States Patent
Hoshino (10) Patent No.: US 8,962,356 B2
(45) Date of Patent: Feb. 24, 2015

(54) METHOD OF MANUFACTURING PHOTONIC CRYSTAL AND METHOD OF MANUFACTURING SURFACE-EMITTING LASER

(71) Applicant: Canon Kabushiki Kaisha, Tokyo (JP)

(72) Inventor: Katsuyuki Hoshino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/796,322

(22) Filed: Mar. 12, 2013

(65) Prior Publication Data

US 2013/0252360 A1 Sep. 26, 2013

(30) Foreign Application Priority Data

Mar. 23, 2012 (JP) ................. 2012-066716

(51) Int. Cl.
 *H01L 21/00* (2006.01)
 *H01L 21/36* (2006.01)
 *H01S 5/30* (2006.01)
 (Continued)

(52) U.S. Cl.
 CPC . *H01L 21/36* (2013.01); *H01S 5/30* (2013.01); *H01S 5/105* (2013.01); *G02B 6/1225* (2013.01); *B82Y 20/00* (2013.01); *H01S 5/183* (2013.01); *H01S 5/34333* (2013.01); *H01S 2304/00* (2013.01); *H01L 21/02389* (2013.01); *H01L 21/02458* (2013.01); *H01L 21/0254* (2013.01); *H01L 21/02603* (2013.01); *H01L 21/0262* (2013.01); *H01L 21/02639* (2013.01); *H01L 21/02647* (2013.01)
 USPC ........................................... 438/22

(58) Field of Classification Search
 CPC ...... G82Y 20/00; H01L 33/0079; H01S 5/12; H01S 5/1231
 See application file for complete search history.

(56) References Cited

U.S. PATENT DOCUMENTS 6,627,520 B2 9/2003 Kozaki et al.
6,627,974 B2 9/2003 Kozaki et al.
(Continued)

FOREIGN PATENT DOCUMENTS

JP 2002-261032 A 9/2002

OTHER PUBLICATIONS

Kazumasa Hiramatsu et al.,"Fabrication and Characterization of Low Defect Density GaN Using Facet-Controlled Epitaxial Lateral Overgrowth (FACELO)," 221(1-4) J. Crystal Growth 316-326 (Dec. 2000).

*Primary Examiner* — Zandra Smith
*Assistant Examiner* — Andre' C Stevenson
(74) *Attorney, Agent, or Firm* — Fitzpatrick, Cella, Harper & Scinto (57) ABSTRACT

Provided is a method of manufacturing a photonic crystal, including: a first step of forming, on a surface of a substrate, a protective mask for selective growth, the protective mask having an opening pattern opened therein; a second step of selectively growing a columnar semiconductor from an exposed portion of the surface of the substrate not having the mask formed thereon, laterally overgrowing the semiconductor layer on the mask, and embedding the mask; a third step of forming a photonic crystal in the semiconductor layer so that openings in the opening pattern and the one of pores and grooves which form the photonic crystal are at least partly overlapped each other when seen from a direction perpendicular to the surface of the substrate; a fourth step of removing at least part of the columnar semiconductor; and a fifth step of removing at least part of the mask.

20 Claims, 4 Drawing Sheets

(51) Int. Cl.
*H01S 5/10* (2006.01)
*G02B 6/122* (2006.01)
*B82Y 20/00* (2011.01)
*H01S 5/183* (2006.01)
*H01S 5/343* (2006.01)
*H01L 21/02* (2006.01)

(56) References Cited

U.S. PATENT DOCUMENTS

| | | | |
|---|---|---|---|
| 6,861,729 B2 | 3/2005 | Kozaki et al. | |
| 2008/0298419 A1* | 12/2008 | Hori et al. | 372/50.124 |
| 2012/0217474 A1* | 8/2012 | Zang et al. | 257/13 |
| 2013/0078578 A1* | 3/2013 | Iyama et al. | 430/296 |

* cited by examiner

METHOD OF MANUFACTURING PHOTONIC CRYSTAL AND METHOD OF MANUFACTURING SURFACE-EMITTING LASER

BACKGROUND OF THE INVENTION

1. Field of the Invention

The present invention relates to a method of manufacturing a photonic crystal and a method of manufacturing a surface-emitting laser.

2. Description of the Related Art

A surface-emitting laser is known in which a high contrast grating (hereinafter referred to as HCG) which is a kind of a two-dimensional photonic crystal or a one-dimensional photonic crystal is utilized as a reflector.

A photonic crystal has a microstructure in which the refractive index is periodically modulated with a period which is equal to or shorter than the wavelength of light. A photonic crystal formed of a semiconductor often includes pores or grooves formed in the semiconductor and uses the refractive index periodical structure of the semiconductor and air.

In order to widen the wavelength bandwidth of the reflector formed of a photonic crystal, it is effective to form an air gap so that a top portion and a bottom portion of the photonic crystal are brought into contact with air to widen the refractive index difference between the photonic crystal and layers over and under the photonic crystal.

As a method of forming an air gap (cavity) under the photonic crystal, a method is well known in which the photonic crystal is formed on a semiconductor layer (sacrifice layer) that can be removed by wet etching and then the sacrifice layer is removed to form the cavity.

However, for example, a nitride semiconductor is difficult to be wet etched, and a photonic crystal formed of a nitride semiconductor has a problem in that it is difficult to form a cavity using such a sacrifice layer.

In order to form such a cavity, Japanese Patent Application Laid-Open No. 2002-261032 proposes a method of manufacturing a nitride semiconductor substrate which is described in the following.

In this method, a protective film having openings formed therein is formed on a support substrate formed of a nitride semiconductor, a first nitride semiconductor is laterally overgrown on the protective film from exposed portions of the support substrate, the growth is stopped so that clearance is provided on the protective film between portions of the first nitride semiconductor layer, and then, the protective film is removed.

By removing the protective film, space is formed below the clearance between the portions of the laterally overgrown first nitride semiconductor.

After that, a second nitride semiconductor is grown from the upper surfaces, or the upper surfaces and the side surfaces, which are laterally overgrown portions, of the first nitride semiconductor, and then the second nitride semiconductor are connected to each other over the spaces. Thus, cavities are formed below the portions of the second nitride semiconductor connected to each other.

However, the method disclosed in Japanese Patent Application Laid-Open No. 2002-261032 cannot remove the nitride semiconductor which is grown on the openings in the protective film, that is, on the exposed portions of the surface of the support substrate, and thus, cannot form the cavities over the exposed portions.

Therefore, when cavities are formed below a photonic crystal by forming the photonic crystal on the semiconductor layer above the cavities formed using the method disclosed in Japanese Patent Application Laid-Open No. 2002-261032, there is a problem in that there are a lot of regions in which such cavities cannot be formed.

The present invention has been made in view of the above-mentioned problem, and has an object to provide a method of manufacturing a photonic crystal and a method of manufacturing a surface-emitting laser which are capable of forming a cavity below a photonic crystal when the photonic crystal formed of a semiconductor that is difficult to be wet etched is manufactured.

SUMMARY OF THE INVENTION

According to an exemplary embodiment of the present invention, there is provided a method of manufacturing a photonic crystal formed by periodically arranging media having different refractive indices, the media including a semiconductor layer and one of pores and grooves, the method including: a first step of forming, on a surface of a substrate, a protective mask for selective growth, the protective mask having an opening pattern opened therein; a second step of selectively growing a columnar semiconductor from an exposed portion of the surface of the substrate not having the protective mask formed thereon, laterally overgrowing the semiconductor layer on the protective mask, and embedding the protective mask; a third step of forming a photonic crystal in the semiconductor layer so that openings in the opening pattern and the one of pores and grooves which form the photonic crystal are at least partly overlapped each other when seen from a direction perpendicular to the surface of the substrate; a fourth step of removing at least part of the columnar semiconductor; and a fifth step of removing at least part of the protective mask.

Further features of the present invention will become apparent from the following description of exemplary embodiments with reference to the attached drawings.

DESCRIPTION OF THE EMBODIMENTS

Next, methods of manufacturing a photonic crystal according to embodiments of the present invention are described.

Embodiment 1

A method of manufacturing a two-dimensional photonic crystal formed of a nitride semiconductor according to Embodiment 1 to which the present invention is applied is described with reference to FIGS. 1A to 1F.

Figure 1A:
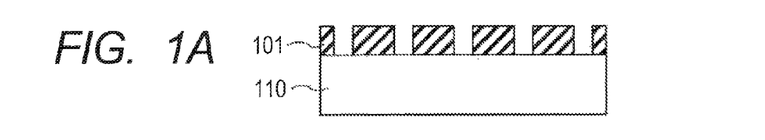
FIG. 1A is a sectional view illustrating a method of manufacturing a photonic crystal according to Embodiment 1 of the present invention.

First, a first step is described, which is a step of preparing a pattern of a protective mask for selectively growing a semiconductor layer which forms a two-dimensional photonic crystal.

First, as illustrated in FIG. 1A, a protective mask 101 for inhibiting the crystal growth of a semiconductor layer is formed on a substrate 110, and an opening pattern is formed in the protective mask 101. The protective mask 101 contains, for example, silicon dioxide.

Note that, the openings may have various kinds of shapes, and, for example, shapes such as circle, hexagon, rectangle, or the like may be used.

The substrate 110 is, for example, a nitride semiconductor of any one of GaN, $Ga_{1-x}In_xN$ (0<x<1), $Al_{1-y}Ga_yN$ (0<y<1), AlN, InN, $Al_{1-w}In_wN$ (0<w<1), and $Al_uGa_{1-v-u}In_vN$ (0<v<1, 0<u+v<1).

Figure 1B:
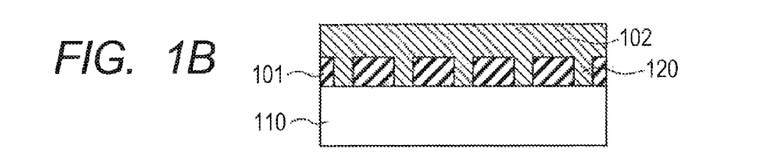
FIG. 1B is a sectional view illustrating the method of manufacturing a photonic crystal according to Embodiment 1 of the present invention.

Next, a second step is described, which is a step of selectively growing the semiconductor layer that forms the two-dimensional photonic crystal.

As illustrated in FIG. 1B, a thin film semiconductor layer 102 is formed by crystal growth using MOCVD process on the substrate 110 having the protective mask 101 with the opened opening pattern formed thereon.

Specifically, a columnar semiconductor 120 (for example, GaN) is selectively grown from portions not having the protective mask 101 formed thereon, that is, exposed portions of the surface of the substrate 110. Then, the thin film semiconductor layer 102 is laterally overgrown on the protective mask 101, and the protective mask 101 is embedded by the thin film semiconductor layer 102. The crystal growth of the thin film semiconductor layer 102 is carried out until the thin film semiconductor layer 102 has a thickness which is necessary for forming the two-dimensional photonic crystal.

Note that, such a structure can be formed using growth conditions for promoting the lateral overgrowth as disclosed in Journal of Crystal Growth, Vol. 221, pp. 316-326, 2000.

For example, the growth pressure is set to 300 Torr and the growth temperature is set to 1,050° C.

Figure 1C:
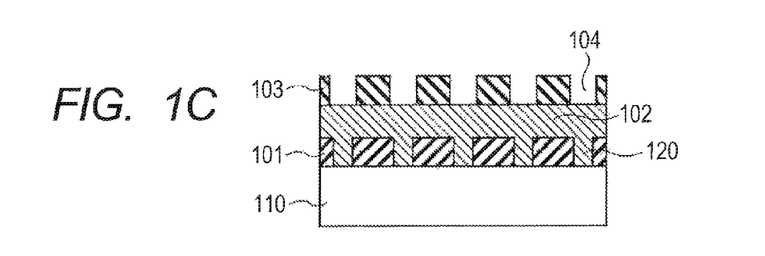
FIG. 1C is a sectional view illustrating the method of manufacturing a photonic crystal according to Embodiment 1 of the present invention.

Next, a third step is described, which is a step of forming the two-dimensional photonic crystal.

First, as illustrated in FIG. 1C, a resist 103 having openings 104 in a pattern of the two-dimensional photonic crystal formed by arrangement with a two-dimensional period is formed on the thin film semiconductor layer 102 by electron beam exposure.

In this case, the resist 103 is formed so that the openings in the opening pattern in the protective mask 101 formed in the first step and the openings 104 in the pattern of the two-dimensional photonic crystal formed in the resist 103 are at least partly overlapped each other when seen from a direction perpendicular to the surface of the substrate 110 (out-of plane direction).

Figure 1D:
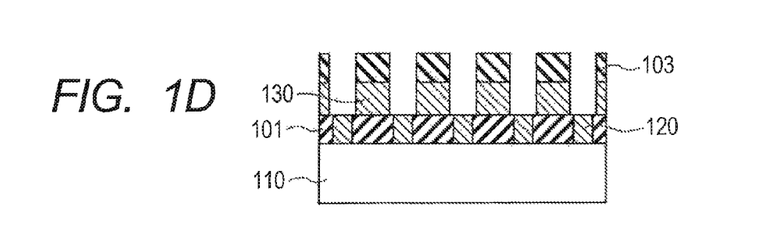
FIG. 1D is a sectional view illustrating the method of manufacturing a photonic crystal according to Embodiment 1 of the present invention.

Then, by dry etching the thin film semiconductor layer 102 with the resist 103 being used as the mask, pores which form the two-dimensional photonic crystal are formed. In this way, as illustrated in FIG. 1D, a two-dimensional photonic crystal 130 is formed.

Figure 1E:
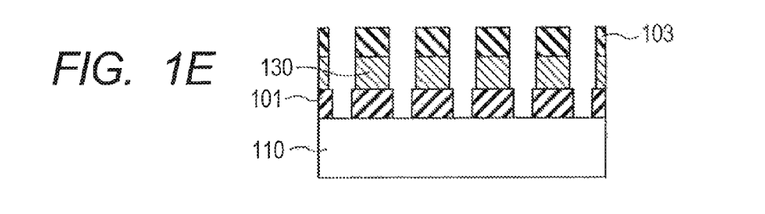
FIG. 1E is a sectional view illustrating the method of manufacturing a photonic crystal according to Embodiment 1 of the present invention.

Next, a fourth step is described, which is a step of forming cavities in at least part of portions under the pores which form the two-dimensional photonic crystal 130.

After the pores which form the two-dimensional photonic crystal 130 are formed by the dry etching in the third step, subsequently thereto, the columnar semiconductor 120 is dry etched with the resist 103 being used as the mask.

In this way, as illustrated in FIG. 1E, at least part of the semiconductor layer below the pores, that is, at least part of the columnar semiconductor 120 formed by crystal growth from the exposed portions of the surface of the substrate 110 in the second step, is removed to form the cavities.

Figure 1F:
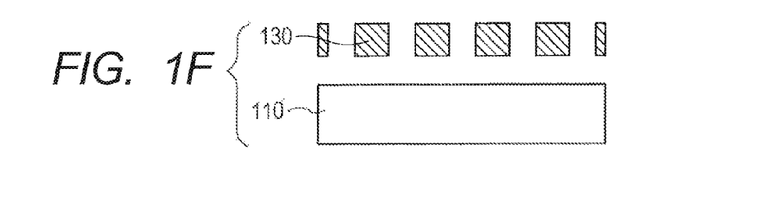
FIG. 1F is a sectional view illustrating the method of manufacturing a photonic crystal according to Embodiment 1 of the present invention.

Next, a fifth step is described, which is a step of removing at least part of the protective mask 101.

The protective mask 101 is removed by wet etching.

When the protective mask 101 is formed of, for example, silicon dioxide, the wet etching can be carried out as follows.

The wet etching can be carried out by, for example, soaking the substrate 110 which has been subjected to the processing from the first step to the fourth step into an etchant such as hydrofluoric acid for a predetermined length of time to expose the substrate 110 to the etchant.

Specifically, the protective mask 101 is exposed to the etchant via the pores which form the two-dimensional photonic crystal 130 and which are formed in the third step and via the cavities formed under the pores in the fourth step, and the protective mask 101 is etched.

In this way, as illustrated in FIG. 1F, the two-dimensional photonic crystal 130 with a cavity formed thereunder is formed.

By the way, the layer thickness of the two-dimensional photonic crystal is determined taking into consideration the waveguide mode of light injected into the two-dimensional photonic crystal, manufacturing conditions of the pores which form the two-dimensional photonic crystal, and the like.

In order to introduce an amount of the light sufficient to function the two-dimensional photonic crystal appropriately into the two-dimensional photonic crystal, it is preferred that the thickness of the two-dimensional photonic crystal be thicker.

On the other hand, as the thickness of the two-dimensional photonic crystal increases, the ratio of the depth of the pores to the diameter of the pores which form the two-dimensional photonic crystal, that is, the aspect ratio (depth/diameter) becomes larger. As a result, it is difficult to form the pores based on the design values.

In particular, in the case of a two-dimensional photonic crystal, the diameter of the pores is an important parameter which determines the diffraction efficiency, and thus it is important to manufacture with accuracy a two-dimensional photonic crystal as designed.

Therefore, it is preferred that the layer thickness of the two-dimensional photonic crystal be as thin as possible insofar as the two-dimensional photonic crystal appropriately functions. For example, the range of the preferred layer thickness of the two-dimensional photonic crystal is from 100 nm to 1 μm.

Compared with the case of Japanese Patent Application Laid-Open No. 2002-261032, the width of the protective mask is different.

According to the description in Japanese Patent Application Laid-Open No. 2002-261032, in order to increase the distance of the lateral overgrowth as much as possible, when the protective mask is formed so as to be stripe-like, it is preferred that the width of the stripe, that is, the mask width of the protective mask be 5 to 20 μm.

Further, according to the description in Japanese Patent Application Laid-Open No. 2002-261032, when the protective mask is formed so as to be lattice-like, it is preferred that the width of a bar in the lattice be 10 to 20 μm.

On the other hand, according to this embodiment, the mask width of the protective mask, in other words, the distance between adjacent openings formed in the protective mask, is smaller than the width of the bar in the lattice disclosed in Japanese Patent Application Laid-Open No. 2002-261032.

In the second step, when the thin film semiconductor layer 102 is laterally overgrown on the protective mask 101 in order to form the semiconductor layer which forms the two-dimensional photonic crystal, both lateral crystal growth of the thin film semiconductor layer 102 and vertical crystal growth of the thin film semiconductor layer 102 are simultaneously carried out.

Therefore, when the distance between adjacent portions not having the protective mask 101 provided thereon, that is, the distance between adjacent exposed portions of the surface of the substrate 110, is large, it takes a lot of time to carry out the lateral overgrowth for embedding the protective mask 101.

As a result, the vertical crystal growth also proceeds, and it becomes difficult to reduce the thickness of the semiconductor layer which forms the two-dimensional photonic crystal.

Therefore, it is preferred that the distance between adjacent openings in the opening pattern in the protective mask 101 be as small as possible.

Further, in the fourth step, the columnar semiconductor 120 which is formed by the crystal growth from the exposed portions of the surface of the substrate 110 is dry etched via the pores which form the two-dimensional photonic crystal, and the cavities are formed under the pores.

Therefore, in order to increase the regions of the cavities under the pores, it is preferred that the period in the pattern of the pores be coincident with the period of the exposed portions of the surface of the substrate 110, that is, the period in the opening pattern in the protective mask 101.

In this case, the arrangement is made so that the pattern of the pores and the opening pattern are at least partly overlapped each other when seen from the direction perpendicular to the surface of the substrate 110.

This enables removal of at least part of the columnar semiconductor 120 and formation of the cavities under the pores with regard to all the pores.

Further, in this case, the distance between adjacent openings in the opening pattern in the protective mask 101 is about several tens of nanometers to several hundreds of nanometers, and thus, it is easier to form the thin film semiconductor layer 102 so as to have the designed thickness.

Further, it is more preferred that the size of the openings in the opening pattern in the protective mask 101, that is, the diameter of the openings be equal to or smaller than the diameter of the pores, and the period in the opening pattern in the protective mask 101 and the period of the pattern of the pores be coincident with each other. In this case, every opening in the opening pattern is arranged so as to be within any one of the pores in the pattern of the pores when seen from the direction perpendicular to the surface of the substrate 110, and in the fourth step, the columnar semiconductor 120 is dry etched.

This enables removal of at least upper portions of the entire columnar semiconductor 120 directly connected to the two-dimensional photonic crystal 130.

Therefore, in the fifth step, by removing at least regions of the protective mask 101 which are held in contact with the two-dimensional photonic crystal 130, a continuous cavity can be formed below the two-dimensional photonic crystal 130.

Further, in the fourth step, when the columnar semiconductor 120 is dry etched, it is preferred that the etching be carried out to the level of the surface of the substrate 110.

This enables formation of a continuous cavity having a fixed height below the two-dimensional photonic crystal 130 when the protective mask 101 is removed in the fifth step.

As a result, the distribution of the refractive index in the direction perpendicular to the surface of the two-dimensional photonic crystal 130 becomes uniform within the surface of the two-dimensional photonic crystal 130, which enables uniform the distribution of light introduced into the two-dimensional photonic crystal within the surface thereof.

Note that, in Embodiment 1, a case is described in which, in the third step, dry etching is carried out with the resist being used as the mask to form the two-dimensional photonic crystal 130.

However, as the mask, for example, silicon dioxide may also be used.

Specifically, after a film of silicon dioxide is formed, a resist in the shape of the two-dimensional photonic crystal is formed on the silicon dioxide film.

Then, the silicon dioxide film is dry etched with the resist being used as the mask.

In this way, a silicon dioxide film in the shape of the two-dimensional photonic crystal is formed. Then, by dry etching the thin film semiconductor layer with the silicon dioxide film being used as the mask, the two-dimensional photonic crystal 130 may be formed.

In this case, in the fourth step, following the third step, dry etching with the silicon dioxide film being used as the mask is continuously carried out to form the cavity below the pores which form the two-dimensional photonic crystal.

Note that, in this embodiment, a case is described in which the substrate 110 and the semiconductor grown on the substrate 110 are a nitride semiconductor, but the present invention is not specifically limited thereto, and, for example, an arsenide semiconductor or a phosphide semiconductor may also be used.

Further, in this embodiment, a method of manufacturing a two-dimensional photonic crystal is described, but the present invention is not specifically limited thereto, and a one-dimensional photonic crystal as a high contrast grating can be manufactured as well through similar steps.

In this case, as the shape of the opening pattern in the protective mask 101 formed in the first step, a shape of stripes, or a shape in which openings in the shape of, for example, a circle, a hexagon, a rectangle, or the like are arranged in stripes may be used.

Further, in the third step, the resist 103 having the openings 104 formed therein in the pattern of the one-dimensional photonic crystal is formed on the thin film semiconductor layer 102.

Specifically, the resist 103 having the openings 104 in the shape of stripes arranged so as to function as a one-dimensional distributed feedback (hereinafter referred to as DFB) reflector or HCG is formed.

This enables formation of a one-dimensional photonic crystal, and by carrying out the fourth step and the fifth step subsequently thereto, a cavity can be formed below the one-dimensional photonic crystal.

Embodiment 2

In Embodiment 2 of the present invention, in a method of manufacturing a surface-emitting laser in which the two-dimensional photonic crystal having an air gap formed therein using the steps of Embodiment 1 is used as a reflector, an exemplary manufacturing process of the two-dimensional photonic crystal via which current can be injected into an active layer is described with reference to FIGS. 2A to 2D.

In the following, the steps of the manufacturing method are described.

Figure 2A:
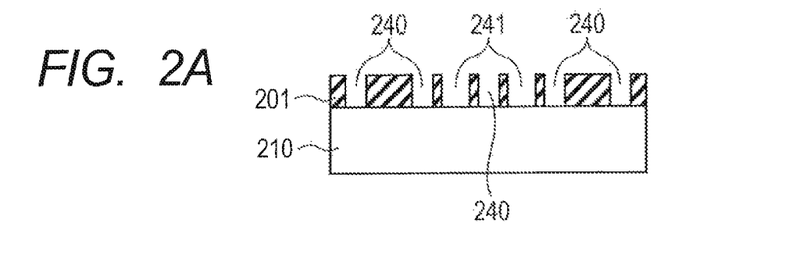
FIG. 2A is a sectional view illustrating a method of manufacturing a photonic crystal according to Embodiment 2 of the present invention.

First, in a first step, as illustrated in FIG. 2A, a protective mask 201 formed of, for example, silicon dioxide, for inhibiting the crystal growth of a semiconductor layer is formed on a substrate 210 having a structure which emits light by current injection, and an opening pattern is opened in the protective mask 201.

Note that, the openings may have various kinds of shapes, and, for example, shapes such as circles, hexagons, rectangles, or the like may be used.

The substrate 210 is formed of, for example, a nitride semiconductor, in which n-type GaN, an active layer, and p-type GaN are formed in this order.

In this case, the opening pattern includes an opening pattern 240 for forming a thin film semiconductor layer which forms a two-dimensional photonic crystal in a second step, and an opening pattern 241 for forming a columnar structure used for current injection from the thin film semiconductor layer into the substrate 210.

Note that, the opening pattern 240 and the opening pattern 241 are preferably not shared.

Note that, part of the opening pattern 240 and part of the opening pattern 241 may be shared.

Next, in a second step, similarly to in Embodiment 1, a thin film semiconductor layer 202 for forming a two-dimensional photonic crystal is formed.

Specifically, a columnar semiconductor 220 is selectively grown from exposed portions of the surface of the substrate 210 not having the protective mask 201 provided thereon, that is, in the regions of the opening pattern 240 and in the regions of the opening pattern 241.

Then, the thin film semiconductor layer is laterally overgrown on the protective mask 201, and the protective mask 201 is embedded.

The crystal growth of the thin film semiconductor layer 202 is carried out until the thin film semiconductor layer 202 has a thickness which is necessary for forming the two-dimensional photonic crystal.

In this case, at least bottom portions of the thin film semiconductor layer 202 and the columnar semiconductor 220 are formed of a semiconductor having a conductivity type in the same polarity as that of the surface of the substrate 210.

Next, a third step and a fourth step are carried out similarly to Embodiment 1.

Figure 2B:
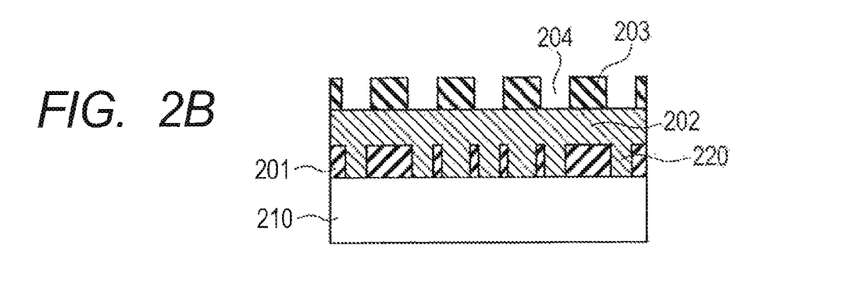
FIG. 2B is a sectional view illustrating the method of manufacturing a photonic crystal according to Embodiment 2 of the present invention.

Specifically, first, in the third step, as illustrated in FIG. 2B, a resist 203 having openings 204 in a pattern of the two-dimensional photonic crystal is formed on the thin film semiconductor layer 202.

In this case, the resist 203 is formed so that the part of the opening pattern 240, which is not shared with the opening pattern 241, forming the protective mask 201 formed in the first step, and the part of the openings 204 are at least overlapped each other when seen from a direction perpendicular to the surface of the substrate 210.

Then, by dry etching the thin film semiconductor layer 202 with the resist 203 being used as the mask, pores which form the two-dimensional photonic crystal are formed.

Figure 2C:
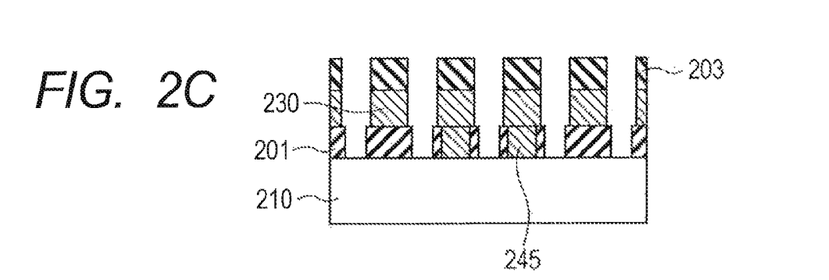
FIG. 2C is a sectional view illustrating the method of manufacturing a photonic crystal according to Embodiment 2 of the present invention.

Next, in a fourth step, as illustrated in FIG. 2C, by dry etching, at least part of the semiconductor layer under the pores, that is, at least part of the columnar semiconductor 220 formed in the regions of the opening pattern 240 is removed to form cavities.

In this case, portions of the columnar semiconductor 220 which are not dry etched and remain, that is, portions of the columnar semiconductor 220 formed in the regions of the opening pattern 241 function as a columnar semiconductor 245 for current injection into the active layer.

Note that, the period in the opening pattern 240 and the period in the pattern of the pores are preferably coincident with each other.

Further, it is more preferred that the diameter of the openings in the opening pattern 240 be equal to or smaller than the diameter of the pores and the period in the opening pattern 240 and the period in the pattern of the pores be coincident with each other.

In this case, it is preferred that every opening in the opening pattern 240 be arranged so as to be within any one of the pores in the pattern of the pores when seen from the direction perpendicular to the surface of the substrate 210.

This enables removal of at least upper portions of the entire columnar semiconductor 220 formed in the regions of the opening pattern 240 to form the cavities.

Further, in the fourth step, when the columnar semiconductor 220 is dry etched, it is preferred that the etching be carried out to the level of the surface of the substrate 210.

Figure 2D:
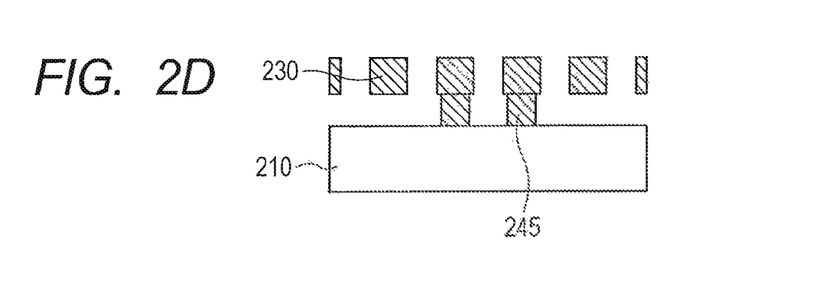
FIG. 2D is a sectional view illustrating the method of manufacturing a photonic crystal according to Embodiment 2 of the present invention.

Next, in a fifth step, similarly to Embodiment 1, at least part of the protective mask 201 is removed.

Specifically, the protective mask 201 is removed by wet etching via the pores and via the cavities formed under the pores.

Note that, at least regions of the protective mask 201 which are held in contact with a two-dimensional photonic crystal 230 are preferably removed.

Further, it is more preferred that the entire protective mask 201 be removed.

In this way, as illustrated in FIG. 2D, the two-dimensional photonic crystal 230 is formed, which is coupled to the substrate 210 through the columnar semiconductor 245 for current injection and below which cavities are formed except for the position of the columnar semiconductor 245.

Note that, in this embodiment, a method of manufacturing a two-dimensional photonic crystal is described, but the present invention is not specifically limited thereto, and a one-dimensional photonic crystal can be manufactured through similar steps.

In this case, as the shape of the opening pattern in the protective mask 201 formed in the first step, a shape of stripes, or a shape in which openings in the shape of, for example, a circle, a hexagon, a rectangle, or the like are arranged in stripes may be used.

Further, in the third step, the resist 203 having the openings 204 formed therein in the pattern of the one-dimensional photonic crystal is formed on the thin film semiconductor layer 202.

Specifically, the resist 203 having the openings 204 in the shape of stripes arranged so as to function as a DFB reflector or HCG is formed.

Then, by carrying out the dry etching with the resist 203 being used as the mask, the one-dimensional photonic crystal can be formed.

Next, the fourth step and the fifth step are carried out.

In this way, a one-dimensional photonic crystal 230 can be formed, which is coupled to the substrate 210 through the columnar semiconductor 245 for current injection and below which cavities are formed except for the position of the columnar semiconductor 245.

EXAMPLES

Next, examples of the present invention are described.

Example 1

In Example 1 of the present invention, a method of manufacturing a vertical cavity surface-emitting laser including a photonic crystal formed by applying the present invention is described with reference to FIGS. 3A to 3D.

Figure 3A:
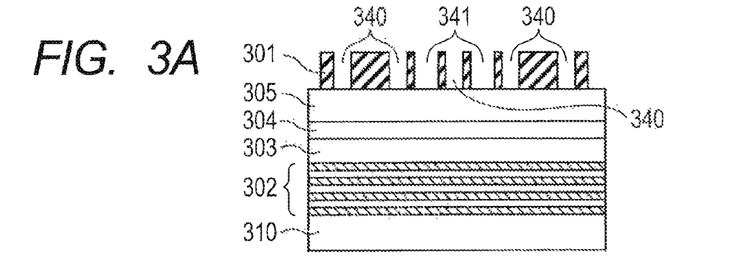
FIG. 3A is a sectional view illustrating an exemplary method of manufacturing a photonic crystal according to Example 1 of the present invention, and illustrates a first step of the manufacturing method.

First, as illustrated in FIG. 3A, on a substrate 310 formed of n-type GaN, crystal growth of a distribution Bragg reflector 302 formed by stacking thin films of n-type GaN/n-type AlGaN for 40 periods, n-type GaN as a lower clad layer (spacer) 303, an active layer 304, and p-type GaN as an upper clad layer 305 in this order is carried out by MOCVD.

In this case, the substrate 310 and the semiconductor layer structure from the distribution Bragg reflector 302 to the upper clad layer 305 formed on the substrate 310 by crystal growth correspond to the substrate 210 described in Embodiment 2. Therefore, the surface of the upper clad layer 305 corresponds to the surface of the substrate 210 described in Embodiment 2.

The active layer 304 forms a multiple quantum well structure of three periods, and the material of the well layers is GaInN while the material of the barrier layers is GaN.

The active layer 304 emits light through carrier injection. Note that, the active layer 304 in this example is not specifically limited to the above-mentioned multiple quantum well structure, and may be a single quantum well structure.

Next, a first step in this example is described with reference to FIG. 3A.

First, a film of silicon dioxide is formed on the upper clad layer 305.

Then, a resist mask is formed on the silicon dioxide film. After a predetermined pattern is applied the resist mask, dry etching is carried out to complete a protective mask 301.

In this case, the protective mask 301 corresponds to the protective mask 201 described in Embodiment 2.

The predetermined pattern applied to the resist mask is a combination of two kinds of patterns.

Specifically, the predetermined pattern is a pattern which is a combination of a first pattern 340 corresponding to the opening pattern 240 described in Embodiment 2 and a second pattern 341 corresponding to the opening pattern 241 described in Embodiment 2.

The first pattern 340 is a pattern of openings which are two-dimensionally and periodically arranged within the plane of the resist mask with a period coincident with the period of the two-dimensional photonic crystal formed by applying the present invention.

In this case, the diameter of the openings in the first pattern 340 is smaller than the diameter of the pores which form the two-dimensional photonic crystal.

Further, the positions of the openings in the first pattern 340 are set to be coincident with the positions at which the two-dimensional photonic crystal is to be formed.

Specifically, every opening in the first pattern 340 is arranged in advance so as to be within any one of the pores which form the two-dimensional photonic crystal when seen from the direction perpendicular to the surface of the upper clad layer 305.

The second pattern 341 is a pattern of openings arranged in at least part of regions of the active layer 304 into which current is required to be injected among portions of the resist mask not having the openings in the first pattern 340 formed therein when seen from the direction perpendicular to the surface of the upper clad layer 305.

Note that, the protective mask 301 in this example is not specifically limited to the above-mentioned silicon dioxide.

Any other material may be used insofar as the material is a medium which functions as a protective mask for inhibiting growth of the semiconductor layer that forms the two-dimensional photonic crystal and has a large etch selectivity with respect to the semiconductor layer.

For example, silicon nitride, zirconium oxide, titanium oxide, or the like can be used.

Further, in this example, the above-mentioned method is used for forming the protective mask 301, but the present invention is not limited thereto.

For example, in this example, dry etching is used for forming the opening pattern in the protective mask 301, but wet etching may also be used.

Further, the protective mask 301 may be formed by forming, on the upper clad layer 305, a resist film having a predetermined shape, for example, forming a silicon dioxide film, and then carrying out lift-off.

Figure 3B:
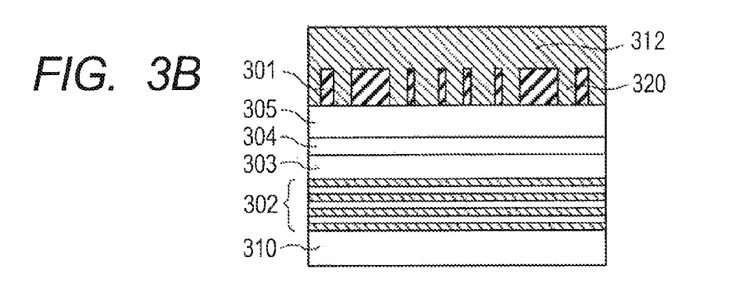
FIG. 3B is a sectional view illustrating the exemplary method of manufacturing a photonic crystal according to Example 1 of the present invention, and illustrates a second step of the manufacturing method.

Next, a second step in this example is described.

FIG. 3B illustrates the second step subsequent to the step illustrated in FIG. 3A.

Specifically, a columnar semiconductor 320 formed of p-type GaN is selectively grown from exposed portions of the surface of the upper clad layer 305 not having the protective mask 301 provided thereon, that is, in the regions of the first pattern 340 and in the regions of the second pattern 341.

Then, crystal growth of a thin film semiconductor layer 312 is carried out as follows.

Predetermined growth conditions which promote the lateral overgrowth of the thin film semiconductor layer 312 are set. For example, the growth pressure is set to 300 Torr and the growth temperature is set to 1,050° C.

Then, the thin film semiconductor layer 312 formed of p-type GaN is laterally overgrown on the protective mask 301, and the protective mask 301 is embedded.

The thin film semiconductor layer 312 is grown continuously until the thin film semiconductor layer 312 has a thickness which is necessary for forming the two-dimensional photonic crystal.

Figure 3C:
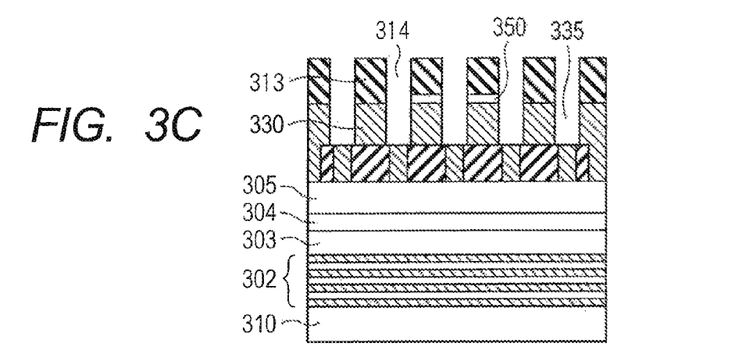
FIG. 3C is a sectional view illustrating the exemplary method of manufacturing a photonic crystal according to Example 1 of the present invention, and illustrates a third step of the manufacturing method.

Next, a third step in this example is described.

FIG. 3C illustrates the third step subsequent to the step illustrated in FIG. 3B.

First, as illustrated in FIG. 3C, p-type electrode 350 is formed on the thin film semiconductor layer 312. Then, a resist 313 having openings 314 in a pattern of the two-dimensional photonic crystal is formed on the p-type electrode 350 by electron beam exposure.

In this case, the resist 313 is formed so that the openings corresponding to the first pattern 340 among the openings in the protective mask 301 formed in the first step is within any one of the openings 314 formed in the resist 313 when seen from the direction perpendicular to the surface of the upper clad layer 305.

Then, the p-type electrode 350 and the thin film semiconductor layer 312 are dry etched with the resist 313 being used as the mask.

Figure 3D:
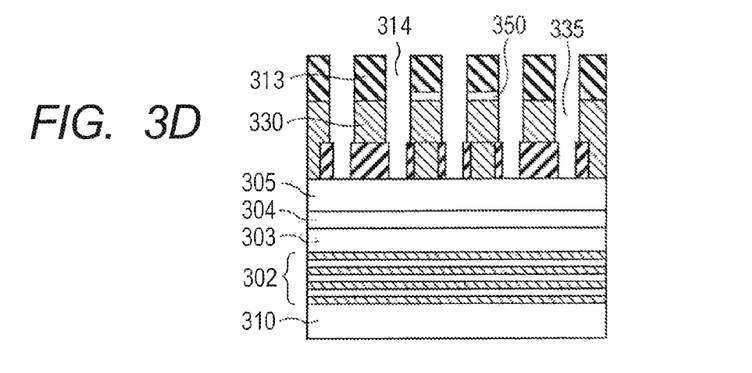
FIG. 3D is a sectional view illustrating the exemplary method of manufacturing a photonic crystal according to Example 1 of the present invention, and illustrates a fourth step of the manufacturing method.

In this way, as illustrated in FIG. 3D, a two-dimensional photonic crystal 330 which has pores 335 in the shape of the two-dimensional photonic crystal is formed.

Next, a fourth step in this example is described.

FIG. 3D illustrates the fourth step subsequent to the step illustrated in FIG. 3C.

After the pores 335 are formed by dry etching in the third step, the dry etching is continuously carried out with the resist 313 being used as the mask. In this way, as illustrated in FIG. 3D, the columnar semiconductor under the pores 335, that is, the columnar semiconductor 320 formed in the regions of the first opening pattern 340 is etched.

Note that, when the columnar semiconductor 320 is dry etched, it is preferred that the etching be carried out to the level of the surface of the upper clad layer 305.

However, the present invention is not specifically limited thereto. It is enough that upper portions of the columnar semiconductor 320 are removed so that cavities are formed to the extent that at least part of the protective mask 301 formed around the columnar semiconductor 320 can be exposed to an etchant for removing the protective mask in the fifth step.

Figure 4:
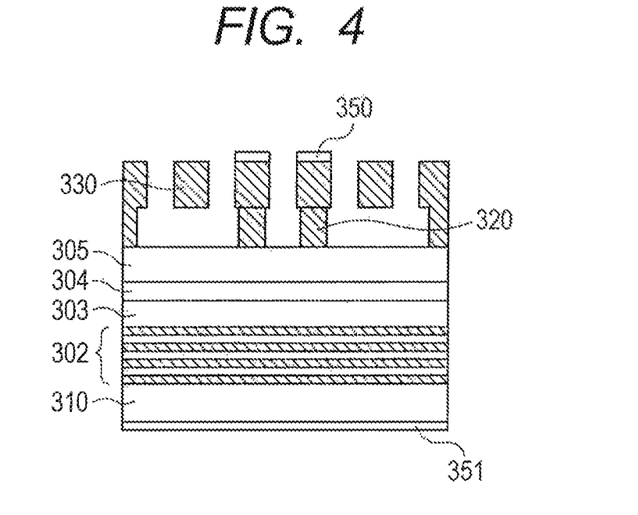
FIG. 4 is a sectional view illustrating the exemplary method of manufacturing a photonic crystal according to Example 1 of the present invention, and illustrates a fifth step subsequent to the fourth step illustrated in FIG. 3D.

Next, a fifth step in this example is described.

FIG. 4 illustrates the fifth step subsequent to the step illustrated in FIG. 3D.

The protective mask 301 is removed by wet etching via the pores 335 and via the cavities formed under the pores 335.

The wet etching can be carried out by, for example, soaking the substrate 310 which has been subjected to the processing from the first step to the fourth step into an etchant such as hydrofluoric acid for a predetermined length of time to expose the substrate 310 to the etchant.

Specifically, the protective mask 301 is exposed to the etchant via the pores 335 which form the two-dimensional photonic crystal 330 and via the cavities under the pores 335, and the protective mask 301 is etched.

In this way, the two-dimensional photonic crystal 330 illustrated in FIG. 4 is formed.

Specifically, the two-dimensional photonic crystal 330 is formed, which is coupled to the upper clad layer 305 through the columnar semiconductor 320 for current injection and below which cavities are formed except for the position of the columnar semiconductor 320.

Note that, the entire protective mask 301 is preferably removed, but the present invention is not specifically limited thereto. Insofar as at least part of the protective mask 301 held in contact with the two-dimensional photonic crystal 330 is removed, more than small effects of the present invention are produced. Next, an n-type electrode 351 is formed on the rear surface of the substrate 310 by photolithography, electron beam deposition, and lift-off.

Through the steps described above, a vertical cavity surface-emitting laser can be manufactured in which the upper reflector is formed of a two-dimensional photonic crystal and the cavities are formed below the two-dimensional photonic crystal.

Note that, in this example, a case is described in which the n-type electrode 351 is formed in the last step, but the present invention is not specifically limited thereto, and the n-type electrode 351 may be formed on the rear surface of the substrate 310, for example, before the first step.

Further, in this example, a case is described in which, after the p-type electrode 350 is formed on the thin film semiconductor layer 312, the p-type electrode 350 and the thin film semiconductor layer 312 are dry etched to form the pores 335 which form the two-dimensional photonic crystal 330. However, the present invention is not specifically limited thereto, and the p-type electrode 350 may be formed on the two-dimensional photonic crystal 330 by photolithography, electron beam deposition, and lift-off after the two-dimensional photonic crystal 330 is formed.

Note that, in this example, a case is described in which the period of the first pattern 340 is coincident with the period of the two-dimensional photonic crystal 330.

Further, in this example, a case is described in which the opening in the first pattern 340 is within any one of the pores 335 which form the two-dimensional photonic crystal 330 when seen from the direction perpendicular to the surface of the upper clad layer 305.

However, the present invention is not specifically limited thereto, and it is enough that the openings in the first pattern 340 and the pores are arranged so as to be at least partly overlapped each other when seen from the direction perpendicular to the surface of the upper clad layer 305.

This enables removal of at least part of the columnar semiconductor 320 formed in the regions of the first opening pattern 340 in the fourth step. Thus, cavities are formed under the pores, and more than small effects of the present invention can be produced. Note that, portions of the columnar semiconductor 320 formed in regions which do not overlap the pores when seen from the direction perpendicular to the surface of the upper clad layer 305 function as a columnar semiconductor for injecting current into the active layer 304.

Specifically, in this case, part of the first pattern 340 also functions as the second pattern 341.

Further, in this example, a case is described in which the diameter of the openings in the first pattern 340 is smaller than the diameter of the pores which form the two-dimensional photonic crystal, but the present invention is not specifically limited, and the diameter of the openings in the first pattern 340 may be equal to or larger than the diameter of the pores which form the two-dimensional photonic crystal.

Further, in this example, the regions in which the openings in the first pattern 340 are formed and the regions in which the openings in the second pattern 341 are formed are different from each other, but the present invention is not specifically limited thereto, and the regions may be overlapped each other.

When the diameter of the openings in the first pattern 340 is larger than the diameter of the pores, the columnar semiconductor for injecting current into the active layer 304 is formed in regions of the openings which do not overlap the pores when seen from the direction perpendicular to the surface of the upper clad layer 305. Specifically, in this case, part of the first pattern 340 also functions as the second pattern 341.

Note that, in this case, the pores and the protective mask 301 are caused to be at least partly overlapped each other when seen from the direction perpendicular to the surface of the upper clad layer 305 so that, in the fifth step, at least part of the protective mask 301 may be removed.

Note that, in this example, a case is described in which an n-type GaN substrate is used as the substrate 310.

However, the present invention is not specifically limited thereto, and, for example, an n-type SiC substrate may also be used.

Further, a buffer layer for reducing dislocation, which is formed of GaN, may be formed by MOCVD process on a sapphire substrate via a strain buffer layer, and the distribution Bragg reflector 302 may be formed thereon.

In this case, the strain buffer layer is thermally decomposed by laser lift-off process to separate the sapphire substrate, and then the n-type electrode is formed.

Further, the method of forming the n-type electrode is not specifically limited to the above-mentioned forming method, and other methods may also be used.

For example, without separating the sapphire substrate, part of the distribution Bragg reflector may be exposed by dry etching process from the front surface side of the surface-emitting laser and the n-type electrode may be formed at the exposed part.

Further, instead of the sapphire substrate, a silicon substrate or the like may be used.

In this case, a GaN buffer layer for reducing dislocation, which is formed of GaN, may be formed by MOCVD process on the silicon substrate via a strain buffer layer, and the distribution Bragg reflector may be formed thereon.

Further, when n-type silicon is used as the silicon substrate, an n-type electrode can be formed on a rear surface of the n-type silicon substrate, and thus the step of separating the substrate becomes unnecessary.

Further, in this example, the n-type layer, the active layer, and the p-type layer are formed in this order, but the present invention is not specifically limited to this order, and the p-type layer, the active layer, and the n-type layer may be formed in this order.

In this case, the two-dimensional photonic crystal is formed of a semiconductor layer formed of n-type GaN.

In this case, the resistance of n-type GaN is lower than the resistance of p-type GaN.

Accordingly, regions through which current flows are limited by the pores which form the two-dimensional photonic crystal. For that reason, the resistance of the two-dimensional photonic crystal is increased, but by forming the two-dimensional photonic crystal of n-type GaN, the resistance of the two-dimensional photonic crystal can be reduced.

Further, in this example, a case is described in which the distribution Bragg reflector 302 is formed of an n-type semiconductor and is conductive.

However, the present invention is not specifically limited thereto, and the distribution Bragg reflector 302 may be formed of a high-resistance undoped semiconductor.

In a case of a distribution Bragg reflector formed of multilayer films of GaN/AlGaN, for the purpose of improving the reflection property of the distribution Bragg reflector, the refractive index difference between GaN and AlGaN is widened. Specifically, it is effective to increase the ratio of Al in AlGaN.

On the other hand, with increasing ratio of Al in n-type AlGaN, it is more difficult to control the doping of n-type impurities, and the conductivity of n-type AlGaN is deteriorated.

Further, as the doped amount of the n-type impurities is increased in order to reduce the resistance of n-type AlGaN, the crystallinity of n-type AlGaN is deteriorated to deteriorate the reflection property of the distribution Bragg reflector.

Therefore, by forming the distribution Bragg reflector 302 of multilayer films of undoped GaN/undoped AlGaN, the reflection property of the distribution Bragg reflector 302 is improved with ease compared with a case in which the distribution Bragg reflector is formed of an n-type semiconductor.

Note that, in this case, part of the lower clad layer 303 is exposed by dry etching from the front surface side of the surface-emitting laser, and the n-type electrode is formed on the exposed surface of the clad layer 303.

Further, in this example, a case is described in which the upper reflector is formed of a two-dimensional photonic crystal.

However, the present invention is not specifically limited thereto, and the upper reflector may be formed of HCG.

In this case, in the first step, the period of the openings in the first pattern 340 formed in the protective mask 301 is coincident with the period in HCG formed by applying the present invention, and the openings are formed in an opening pattern so as to be stripe-like.

In this case, the width of the openings in the first pattern 340 (width of stripe-like grooves) is equal to or smaller than the width of the openings forming the HCG, that is, the width of the stripe-like grooves.

Further, the positions of the openings in the first pattern 340 are set to be coincident with the positions at which the stripe-like grooves forming the HCG are formed.

Specifically, every opening in the first pattern 340 is arranged in advance so as to be within any one of the stripe-like grooves which form the HCG when seen from the direction perpendicular to the surface of the upper clad layer 305.

Further, in the third step, by forming the resist 313 having the openings 314 formed therein having the pattern of the HCG and then carrying out the dry etching with the resist 313 being used as the mask, the HCG is formed in the thin film semiconductor layer 312.

Then, by carrying out the fourth step and the fifth step, the surface-emitting laser in which the upper reflector is formed of HCG is manufactured.

Example 2

In Example 2 of the present invention, which differs from Example 1, a method of manufacturing a distributed feedback surface-emitting laser in which a single two-dimensional photonic crystal is formed as a laser resonator, laser amplification is caused in a horizontal direction (in-plane direction), and light is taken out in a direction perpendicular to the crystal plane is described with reference to FIG. 5.

Figure 5:
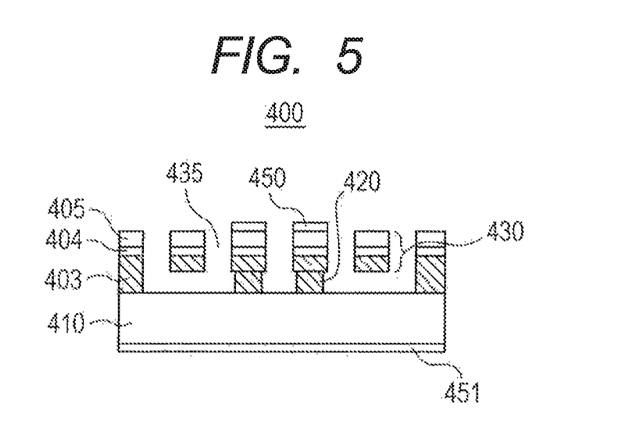
FIG. 5 is a sectional view illustrating an exemplary manufacturing method according to Example 2 of the present invention.

In FIG. 5, the surface-emitting layer 400 includes electrodes 450 and 451, the substrate and contact layer 410, the lower clad layer 403, the active layer 404, and the upper clad layer 405.

First, in a step similar to the first step of Example 1 illustrated in FIG. 3A, a protective mask in a predetermined pattern is formed on the substrate 410 formed of n-type GaN.

The predetermined pattern is a combination of two kinds of patterns.

Specifically, the predetermined pattern is a pattern which is a combination of a first pattern of openings which are two-dimensionally and periodically arranged within a plane with a period coincident with the period of a two-dimensional photonic crystal 430 formed by applying the present invention, and a second pattern of openings arranged in regions of the active layer 404 into which current is required to be injected.

Then, in a step similar to the second step of Example 1 illustrated in FIG. 3B, the protective mask is embedded in the lower clad layer 403 formed of n-type GaN.

Then, the active layer 404 and the upper clad layer 405 formed of p-type GaN are grown in this order on the lower clad layer 403.

Then, in a step similar to the third step of Example 1 illustrated in FIGS. 3C and 3D, pores 435 which form the two-dimensional photonic crystal 430 are formed by dry etching from the surface of the upper clad layer 405.

In this case, the pores 435 are formed by carrying out the dry etching through the upper clad layer 405, the active layer 404, and the lower clad layer 403 so as to reach the protective mask.

Then, in a step similar to the fourth step of Example 1 illustrated in FIG. 3D, a columnar semiconductor under the pores 435 is removed by dry etching.

Then, in a step similar to the fifth step of Example 1, the protective mask is removed.

In this way, the two-dimensional photonic crystal 430 illustrated in FIG. 5 is formed.

Specifically, the two-dimensional photonic crystal 430 is formed, which is coupled to the substrate and contact layer 410 through the columnar semiconductor 420 for current injection and below which cavities are formed except for the position of the columnar semiconductor 420.

Then, the n-type electrode 451 is formed on a rear surface of the n-type GaN substrate as the substrate and the contact layer 410 to complete the surface-emitting laser 400.

According to this example, a layer of air (refractive index of 1.0) having a refractive index which is greatly different from the refractive index of the lower clad layer 403 (2.54 in the case of GaN) can be formed below the lower clad layer 403.

As a result, light confinement within the active layer 404 and the two-dimensional photonic crystal 430 can be improved to improve the characteristics of the surface-emitting laser 400.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-066716, filed Mar. 23, 2012, which is hereby incorporated by reference herein in its entirety.

What is claimed is:

1. A method of manufacturing a structure having periodically modulated refractive indices, the structure including a semiconductor layer in which at least one of pores and grooves are formed, the method comprising:
   a first step of forming, on a surface of a substrate, a protective mask having an opening pattern;
   a second step of forming a semiconductor layer on a top surface of the protective mask and an exposed portion of the surface of the substrate, which is exposed through the opening pattern of the protective mask, and embedding the protective mask;
   a third step of forming the at least one of pores and grooves in the semiconductor layer so that the at least one of pores and grooves at least partly overlap the semiconductor layer formed on the exposed portion of the surface of the substrate as seen from a direction perpendicular to the surface of the substrate;
   a fourth step of removing at least a part of the semiconductor layer formed on the exposed portion of the surface of the substrate; and
   a fifth step of removing at least a part of the protective mask.

2. The method according to claim 1, wherein the opening pattern has a period which is coincident with a period of the one of pores and grooves.

3. The method according to claim 1, wherein openings in the opening pattern have a size which is equal to or smaller than a diameter or width of the at least one of pores and grooves.

4. The method according to claim 1, wherein each opening in the opening pattern is arranged so as to be within one of the at least one of pores and grooves as seen from the direction perpendicular to the surface of the substrate.

5. The method according to claim 1, wherein:
   the semiconductor layer and the substrate are formed of a semiconductor having conductivity;
   one of the substrate and the semiconductor layer includes an active layer;
   the opening pattern includes a first opening pattern and a second opening pattern;
   the first opening pattern is an opening pattern for forming the semiconductor layer;
   the second opening pattern is an opening pattern for forming a structure for injecting current into the active layer;
   the third step comprises forming the at least one of pores and grooves so that the at least one of pores and grooves overlap the first opening pattern other than the second opening pattern at least partly as seen from the direction perpendicular to the surface of the substrate; and
   the fourth step comprises removing at least part of the semiconductor layer formed in regions corresponding to first opening pattern.

6. The method according to claim 5, wherein the first opening pattern has a period which is coincident with a period of the at least one of pores and grooves.

7. The method according to claim 5, wherein openings in the first opening pattern have a size which is equal to or smaller than a diameter or a width of the at least one of pores and grooves.

8. The method according to claim 5, wherein each opening in the first opening pattern is arranged so as to be within one of the at least one of pores and grooves as seen from the direction perpendicular to the surface of the substrate.

9. The method according to claim 1, wherein the fourth step comprises forming an air gap in at least part of a region below the structure by removing at least part of the semiconductor layer formed on the exposed portion of the surface of the substrate via the at least one of pores and grooves.

10. The method according to claim 1, wherein the fifth step comprises forming an air gap in at least part of a region below the structure by removing at least part of the protective mask via the at least one of pores and grooves.

11. The method according to claim 1, wherein the protective mask comprises at least one of silicon oxide, silicon nitride, zirconium oxide, and titanium oxide.

12. The method according to claim 1, wherein the removing of the protective mask is carried out by wet etching.

13. The method according to claim 1, wherein the semiconductor layer comprises a nitride semiconductor.

14. The method according to claim 1, wherein the structure is a two-dimensional photonic crystal.

15. The method according to claim 1, wherein the structure is a one-dimensional photonic crystal.

16. The method according to claim 1, wherein the structure is a high contrast grating.

17. A method of manufacturing a surface-emitting laser, the method comprising the method according to claim 1.

18. The method of manufacturing a surface-emitting laser according to claim 17, wherein the structure is a two-dimensional photonic crystal.

19. The method of manufacturing a surface-emitting laser according to claim 17, wherein the structure is a high contrast grating.

20. The method of manufacturing a surface-emitting layer according to claim 17, wherein the structure is a one-dimensional photonic crystal.

* * * * *